United States Patent
Arita et al.

(10) Patent No.: US 6,784,112 B2
(45) Date of Patent: Aug. 31, 2004

(54) METHOD FOR SURFACE TREATMENT OF SILICON BASED SUBSTRATE

(75) Inventors: Kiyoshi Arita, Fukuoka (JP); Tetsuhiro Iwai, Kasuga (JP); Hiroshi Haji, Chikushino (JP); Shoji Sakemi, Ogoori (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 143 days.

(21) Appl. No.: 10/114,320

(22) Filed: Apr. 3, 2002

(65) Prior Publication Data

US 2002/0148810 A1 Oct. 17, 2002

(30) Foreign Application Priority Data

Apr. 5, 2001 (JP) ........................................ 2001-106757

(51) Int. Cl.[7] .............................................. H01L 21/302
(52) U.S. Cl. ...................................... 438/714; 438/719
(58) Field of Search ................................ 438/706, 710, 438/712, 714, 719, 974

(56) References Cited

U.S. PATENT DOCUMENTS

| | | | | |
|---|---|---|---|---|
| 4,092,210 A | * | 5/1978 | Hoepfner | 216/47 |
| 5,182,234 A | * | 1/1993 | Meyer | 438/695 |
| 5,627,395 A | * | 5/1997 | Witek et al. | 257/350 |
| 5,662,768 A | * | 9/1997 | Rostoker | 257/301 |
| 5,846,442 A | * | 12/1998 | Pasco | 216/41 |
| 5,861,343 A | * | 1/1999 | Tseng | 438/666 |
| 6,277,700 B1 | * | 8/2001 | Yu et al. | 438/303 |
| 6,333,271 B1 | * | 12/2001 | Chiu et al. | 438/706 |
| 6,337,257 B1 | | 1/2002 | Toyosawa | |

FOREIGN PATENT DOCUMENTS

| | | |
|---|---|---|
| JP | 1-270216 | 10/1989 |
| JP | 2000-124177 | 4/2000 |
| JP | 2000-299354 | 10/2000 |

* cited by examiner

*Primary Examiner*—Kin-Chan Chen

(57) ABSTRACT

A surface treatment method for thinning a silicon based substrate obtains a milky-dull color on an overall surface uniformly of the silicon based substrate. To be more specific, a surface opposite to a circuit-formed surface is mechanically polished, then the surface is etched using inert gas such as argon gas for producing plasma. This etching forms micro dimples uniformly on the surface. Next, the surface is further etched using fluorine based gas for producing plasma. This etching obtains a milky-dull color uniformly on the surface. As a result, printed marks on the surface can be read with ease, and pick-up errors in die-bonding can be reduced.

7 Claims, 3 Drawing Sheets

METHOD FOR SURFACE TREATMENT OF SILICON BASED SUBSTRATE

FIELD OF THE INVENTION

The present invention relates to a surface treatment method of a silicon based substrate, and more particularly, it relates to an etching process using plasma.

BACKGROUND OF THE INVENTION

In a manufacturing process of silicon substrates which are used in semiconductor devices, a thinning-substrate process is prepared for thinning a substrate in order to produce slim semiconductor devices. After circuit patterns are formed on a surface of a silicon substrate, this thinning-substrate process is done by mechanical polishing on a face opposite to the circuit-formed surface. However, the mechanical polishing invites a stress-alteration layer including micro cracks on the surface or around the surface layer of the silicon substrate. The stress-alteration layer would lower the strength of the silicon substrate, therefore, an etching process is provided after the mechanical polishing in order to remove the stress-alteration layer formed on the silicon surface. A plasma etching process has been discussed to be used as a new etching method alternative to a conventional wet-etching method. Because the plasma etching process does not produce chemicals or industrial waste, both of which have been produced by the conventional wet-etching method.

This plasma etching for silicon substrate uses mixed gas including fluorine based gas such as carbon tetrafluoride ($CF_4$) or sulfur hexafluoride ($SF_6$) in order to produce plasma. The fluorine based gas is ionized or excited by plasma discharge, and these ions or radicals etch the silicon surface.

This plasma etching process leaves reaction product on the surface, and the reaction product sometimes attaches again to the surface of the silicon substrate. Etching speed differs depending on a place, e.g., the speed at a place where the reaction product attaches is different from the speed at another place where no reaction product attaches. As a result, an ununiform milky dull color appears on the surface after the etching. This appearance degrades the product per se. To overcome this appearance problem, when a silicon substrate is etched by plasma, the entire surface of the silicon substrate is etched as uniform as possible so that the etched surface can be finished as a mirror surface. A condition of plasma processing is prepared for obtaining this mirror surface.

When the etched surface is finished as a mirror surface, an appearance of the product becomes good; however, the product encounters the following problems. First, marks printed on the surface after the etching are difficult to read. To be more specific, marks indicating a product name and a lot number are printed by a laser marker on a silicon substrate after the etching; however, a mirror surface with the marks printed gives a poor contrast, which makes the marks difficult to be recognized.

Second, in die-bonding, i.e., when a semiconductor chip is mounted to a substrate such as a lead frame after the semiconductor chip is cut from the silicon substrate, the semiconductor chip is hard to remove from adhesive tape. In the die-bonding, the silicon substrate is bonded to adhesive tape on its etched surface (the surface opposite to the surface where circuits are formed), and a semiconductor chip is detached from the adhesive tape by a sucking nozzle one by one, and picked up before die-bonded to a given board. When the etched surface is finished as a mirror surface, adhesive strength between a semiconductor chip and adhesive tape becomes excessively strong, so that the semiconductor chip sometimes cannot be removed in a regular way. Even if the semiconductor chip is stuck up upward by an ejector pin when the chip is picked up, the chip is hard to remove from the tape. This situation invites an error in picking up operation.

In the conventional surface treatment of a silicon based substrate, when a process condition is prepared for obtaining a mirror surface as an etched surface, the problems discussed above occur. This is because an appearance quality is given priority. If another condition is prepared for avoiding the problems and admitting a milky-dull color appearance, the milky-dull color appears ununiformly.

The present invention provides a surface treatment method of a silicon based substrate. Through this method, the surface is etched using plasma, and a uniform milky-dull color appears on an etched surface, so that a good appearance is obtained. Further, die-bonding operation free from pick-up errors can be expected.

SUMMARY OF THE INVENTION

The present invention addresses the problem discussed above, and a surface-treatment method of the invention comprises the following steps:

a step of first plasma etching for forming fine dimples on a polished surface of a silicon based substrate which has undergone a thinning process by mechanical polishing; and a step of second plasma etching by plasma process using gas for producing plasma, the gas including fluorine based gas.

Through these two steps, a uniform milky-dull color appears on an entire etched surface of the substrate. This is an object of the present invention.

A method of surface-treatment of a silicon based substrate comprises at least the following steps.

a first plasma etching for forming fine dimples on a surface to be etched; and a second plasma etching, carried out after the first plasma etching, for further etching the surface through plasma process using gas for producing plasma, the gas including fluorine based gas.

This surface treatment allows printed marks on the surface to be read with ease even if the substrate is mechanically polished for being thinned. Also the surface treatment prevents an error in picking up operation when a semiconductor chip is die-bonded on a given board. As a result, thin semiconductor devices can be manufactured efficiently.

DETAILED DESCRIPTION OF THE EXEMPLARY EMBODIMENT

Figure 1:
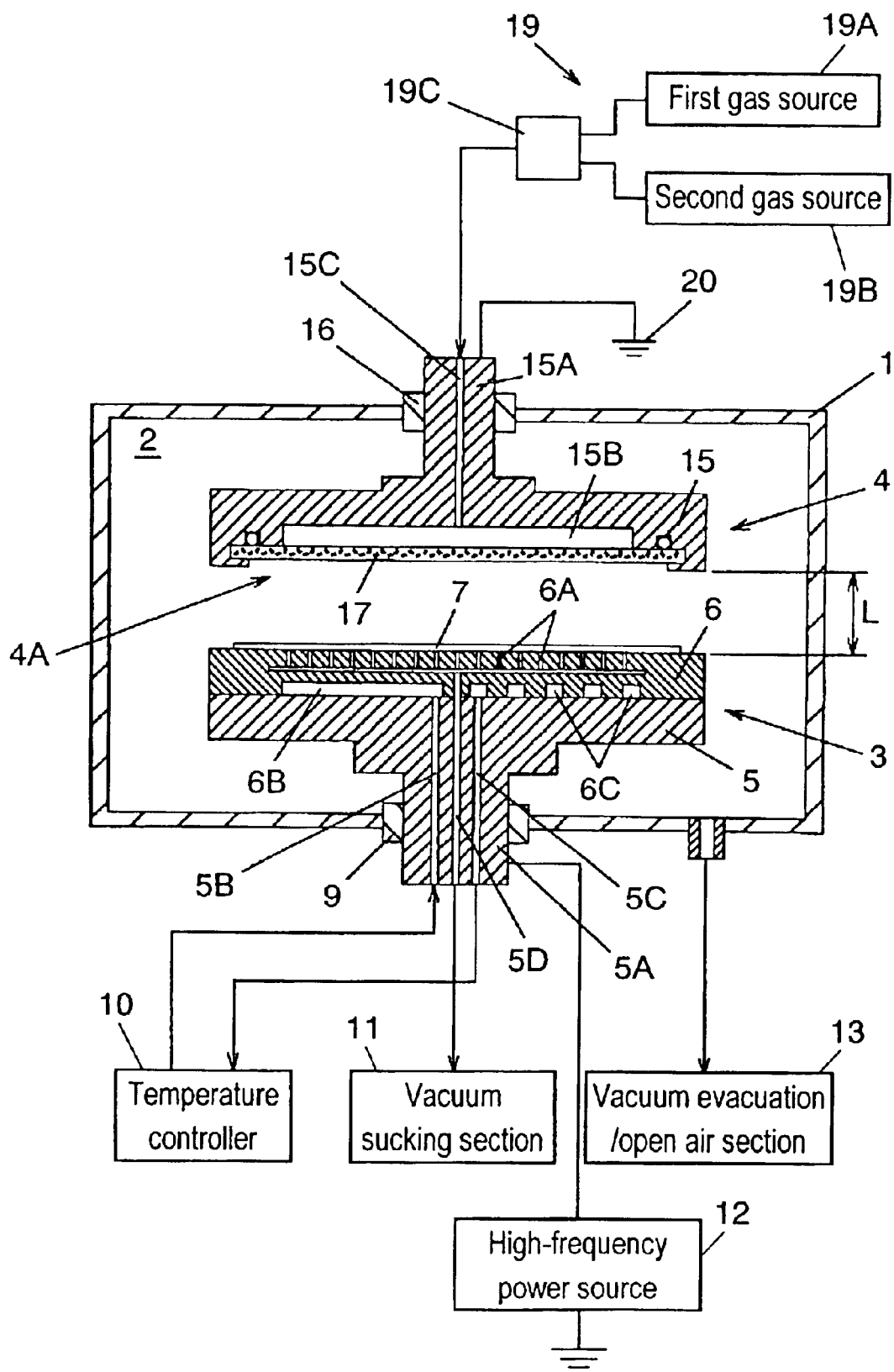
FIG. 1 is a sectional view of a plasma processor in accordance with an exemplary embodiment of the present invention.

FIG. 1 is a sectional view of a plasma processor in accordance with the exemplary embodiment of the present invention. In FIG. 1, an inside of vacuum chamber 1 is used as process room 2 where plasma is applied to a substrate. In process room 2, lower electrode 3 and upper electrode 4 face each other vertically. Lower electrode 3 includes electrode substance 5 which is fitted to vacuum chamber 1 via insulator 9 by supporter 5A extending downward. On an upper face of electrode substance 5, substrate holder 6 made of highly heat conductive material is mounted. Silicon based substrate 7 such as silicon substrate is placed on a surface of substrate holder 6. The surface faces discharge space.

Figure 2A:
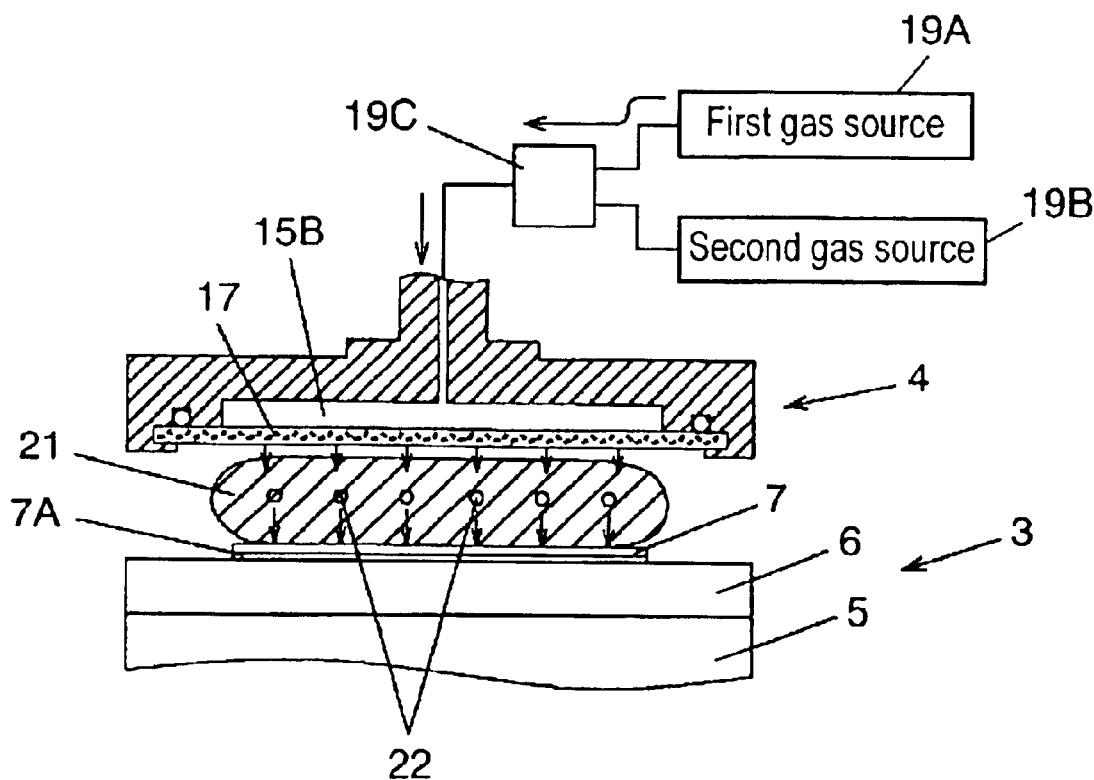
FIG. 2A and FIG. 2B illustrate how the plasma processor works in accordance with the exemplary embodiment.

Silicon substrate 7 has undergone a thinning process, i.e., a face, opposite to the other face where circuits are formed, was mechanically polished. As shown in FIG. 2A, silicon substrate 7 together with protective tape 7A bonded on its circuit-formed face is placed on substrate holder 6. In other words, silicon substrate 7 is placed on substrate holder 6 with its face to be etched (i.e., a polished face, or a face opposite to the circuit-formed face) exposed to a space where plasma is to be irradiated. Protective tape 7A is not always needed, and can be eliminated. In such a case, silicon substrate 7 is directly placed on substrate holder 6.

In substrate holder 6, numbers of adsorbing holes 6A are prepared. Holes 6A run to the upper face of holder 6 and communicate to sucking duct 5D extending through supporter 5A. Sucking duct 5D is connected to vacuum sucking section 11, thus silicon substrate 7 is held on holder 6 by vacuum suck from vacuum sucking section 11. Vacuum sucking section 11 and lower electrode 3 including electrode substance 5 and substrate holder 6 form holding means for holding substrate 7. Another method for holding silicon substrate 7 on holder 6 is this: a dc voltage is applied to electrode substance 5 to produce electrostatic force, so that substrate 7 is adsorbed and held on holder 6.

In substrate holder 6, coolant flowing paths 6B, 6C are prepared, and they communicate to pipes 5B, 5C running through supporter 5A. Pipes 5B, 5C are connected to temperature controller 10. Driving temperature controller 10 allows the coolant such as cool water or cooled gas to circulate through coolant paths 6B, 6C, thereby cooling substrate holder 6 which is heated by heat produced in plasma processing. As a result, the temperature of substrate holder 6 is controlled at a certain level. This control allows silicon substrate 7 to be at a predetermined temperature when plasma etching is performed. This temperature control can uniform an etching speed on an objective surface in the plasma etching.

Electrode substance 5 is electrically connected to high-frequency power source 12. Process room 2 in vacuum chamber 1 is connected to vacuum evacuation/open air section 13, which evacuates process room 2 to turn it in a given vacuum condition and releases process room 2 kept in vacuum condition to open air.

Upper electrode 4 (it is called also an opposite electrode) includes electrode substance 15 grounded via grounding section 20. Electrode substance 15 is fitted to vacuum chamber 1 via insulator 16 by supporter 15A extending upward. Beneath a lower face of electrode substance 15, i.e., the face facing the discharge space, porous member 17 including numbers of micro-pores provided at random is mounted. These micro-pores communicate to open space 15B in electrode substance 15. Open space 15B is also connected to gas supplying section 19 via gas supplying path 15C extending through supporter 15A. Upper electrode 4 can be moved up and down by a mechanism (not shown), so that distance "L" between upper electrode 4 and lower electrode 3 can be arbitrarily set.

Gas supplying section 19 comprises first gas source 19A, second gas source 19B and gas switching valve 19C. First gas source 19A supplies inert gas such as argon gas to process room 2. Second gas source 19B supplies mixed gas including fluorine based gas such as carbon tetrafluoride ($CF_4$) or sulfur hexafluoride ($SF_6$), or another mixed gas including fluorine based gas, hydrogen, and inert gas, or still another gas mixed with hydrogen and inert gas. Gas switching valve 19C can switch a supply of the inert gas to a supply of the fluorine based gas into process room 2 or vice versa for producing plasma.

Process room 2 is evacuated and turned into a vacuum condition by driving vacuum evacuation/open air section 13. Then gas supplying section 19 is driven so that the gas for producing plasma blowouts from the micro-pores of porous member 17 to the discharge space. In this status, high-frequency power source 12 is driven and a high frequency voltage is applied to electrode substance 5 of lower electrode 3, whereby plasma is discharged in the space between upper and lower electrodes 4 and 3. This plasma discharge produces plasma, which etches a silicon substrate surface exposed to the discharge space.

A plasma etching process, using this plasma processor, prepared for silicon substrate 7 is demonstrated hereinafter with reference to FIG. 2 and FIG. 3. Silicon substrate 7 bonded to protective tape 7A is placed on substrate holder 6 of lower electrode 3, and held there by vacuum adsorption. Plasma process starts from this condition.

First plasma-etching is carried out. Distance "L" between lower electrode 3 and upper electrode 4 is set ranging from 20 to 50 mm, then the plasma process starts. As shown in FIG. 2A, gas switching valve 19C is set to run gas from first gas source 19A. Process room 2 is evacuated and turned into a vacuum condition, then argon gas for producing plasma is supplied. The argon gas is blown out from the micro-pores of porous member 17 to the exposed face of silicon substrate 7. At this time, a pressure of the argon gas in room 2 is set ranging from several of Pa to several tens of Pa.

In this status, high-frequency power source 12 is driven and a high frequency voltage is applied between lower electrode 3 and upper electrode 4, whereby plasma is discharged in the space between upper and lower electrodes 4 and 3. As shown in hatched section 21 of FIG. 2A, in the space between upper electrode 4 and the exposed face of silicon substrate 7, plasma is produced by argon gas working as exciting gas, and argon ions 22 collide against the exposed face of silicon substrate 7.

Figure 3A:
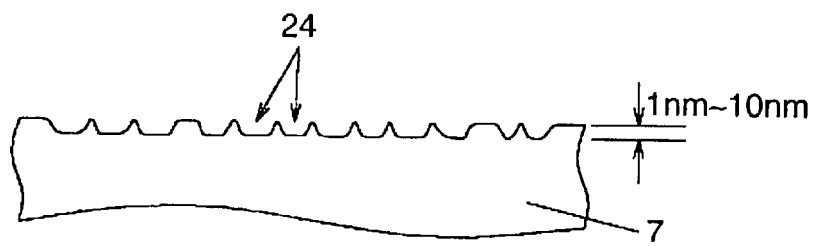
FIG. 3A through FIG. 3D are enlarged sectional views of an etched surface undergone the plasma processor in accordance with the exemplary embodiment.
Figure 3B:
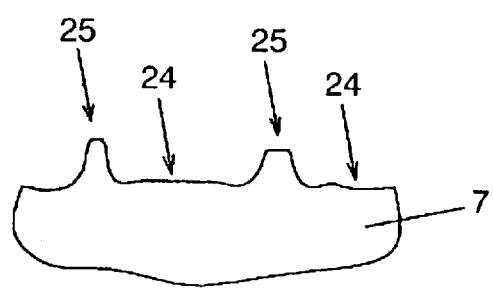

This collision of argon ions 22 against the exposed face of silicon substrate 7 removes silicon partially from the surface due to sputtering effect. FIG. 3A shows this removal, which leaves fine dimples 24 ranging from 1 to 10 nm deep on the surface of silicon substrate 7. As a result, as shown in FIG. 3B, on the overall surface of silicon substrate 7, both of fine dimples 24 left after the removal and surface remaining parts 25 exist uniformly. In other words, fine dimples are uniformly formed on the overall surface.

Figure 2B:
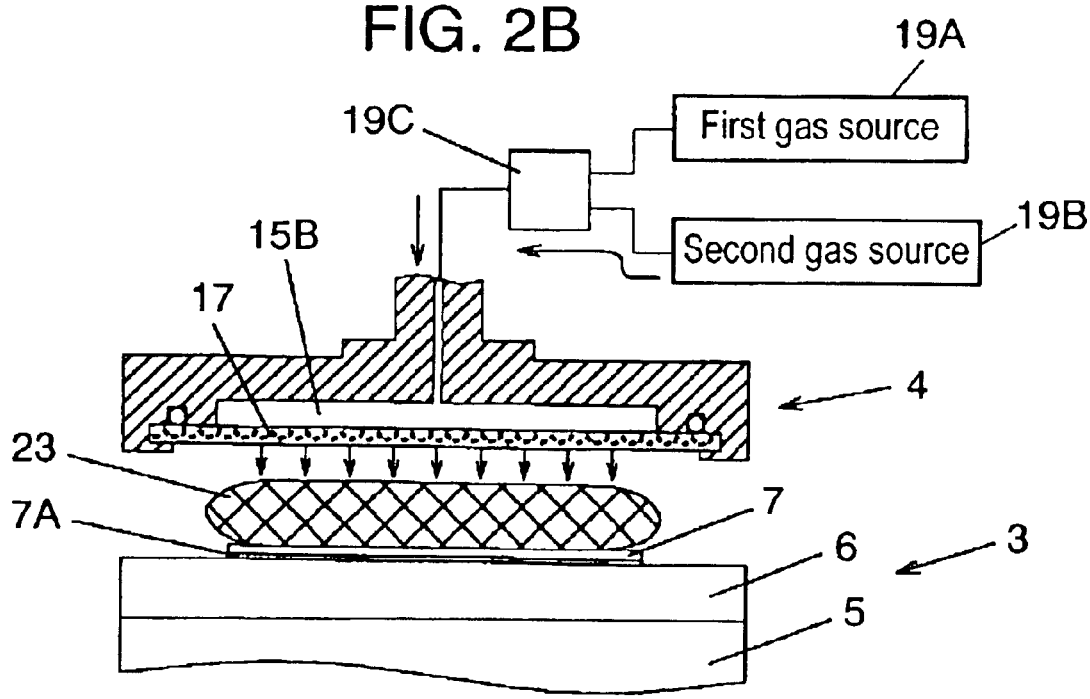

Then second plasma etching is carried out. Upper electrode 4 is lowered from the status of the first plasma etching, so that distance "L" between the electrodes is set at not more than 20 mm. Next, room 2 is evacuated whereby argon gas is discharged. As shown in FIG. 2B, gas switching valve 19C is switched to second gas source 19B for supplying fluorine based gas as plasma generating gas to process room 2. Then the fluorine based gas blows from the micro-pores of porous member 17 against the upper face of silicon substrate 7. The pressure at this time is set within a range of 100–1000 Pa in order to produce plasma in a higher density.

In this status, high-frequency power source 12 is driven and a high frequency voltage is applied between lower electrode 3 and upper electrode 4, whereby plasma is discharged in the space above silicon substrate 7. Plasma is discharged in the fluorine based gas, therefore, as shown in hatched section 23 of FIG. 2B, plasma is produced by the gas mixed with fluorine based gas in the space between upper electrode 4 and the upper face of silicon substrate 7. The fluorine based gas produces ions and radicals due to this plasma discharging, and they collide against the exposed face of the silicon substrate 7. This collision is followed by sputtering effect and chemical etching effect, so that the exposed face of silicon substrate 7 is etched.

Figure 3C:
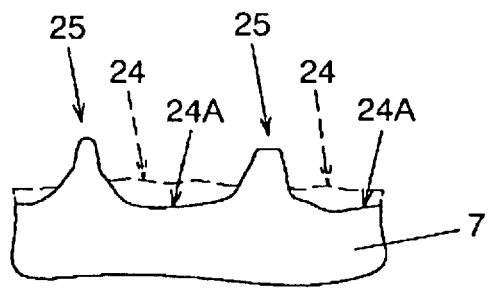
Figure 3D:
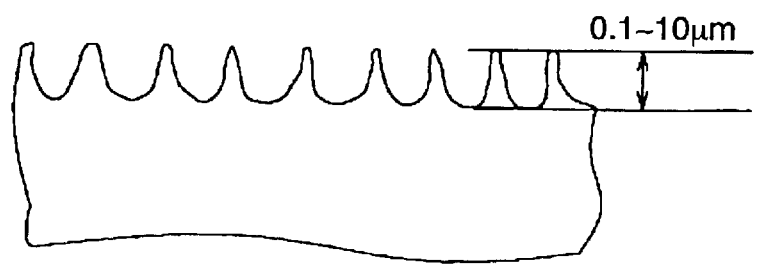

At this time, the ions and radicals produced from the fluorine based gas work locally only on flat sections of the exposed face, namely, bottom sections of dimples 24. Surface remaining parts 25 are thus not etched so much in the second plasma etching as shown in FIG. 3C, and dimples 24 are selected to be etched. When the plasma etching progresses further, the depths of dimples 24 increase as dimples 24A illustrate. When the etching still further progresses, dimples having depths ranging from 0.1 to 10 µm are uniformly formed on the surface of silicon substrate 7 as shown in FIG. 3D. A milky-dull color, namely, the depths of dimples on the surface, can be produced arbitrarily by controlling an etching time.

In this second plasma etching process, temperature control section 10 controls a temperature of silicon substrate 7 at not less than 40° C. Silicon substrate 7 is processed at this temperature, and the surface of silicon substrate 7 is thus warmed, so that energy of gaseous reaction product, produced by chemical reaction between the fluorine radical and the silicon, becomes greater. As a result, although the reaction product hits against the exposed face of silicon substrate 7, less amount of the reaction product remains on the surface, but more amount of the reaction product leaves the surface. This result causes no dispersion in the etching speed, because the dispersion occurs due to ununiform accumulation of the reaction product on the surface. A uniform plasma etching can be thus expected. The objective of the present invention does not set an upper limit to the process temperature, but the upper limit is set by the temperature developed in the plasma processor. In general, a plasma processor is designed to withstand a temperature of approx. 300° C., however, the process temperature is not always limited under this temperature. If the plasma processor is specially designed to be heat resistant, the process temperature can be raised.

The surface treatment discussed in this embodiment combines the first plasma etching with the second plasma etching. In the first plasma etching, micro dimples 24 are uniformly formed on the overall exposed surface of silicon substrate 7. Next, in the second plasma etching, the depths of these micro dimples 24 are further deepened. Eventually, these dimples are uniformly formed on the surface etched by plasma, and the depths of the dimples are approx. the same. In other words, a milky-dull color appears uniformly on the overall surface etched by plasma.

As a result, the problems due to an excessive mirror surface etched can be prevented. The problems are, for instance, poorly readable printed marks; and errors of picking up a semiconductor chip from adhesive tape in the die-bonding process due to of excessive adhesion force between the chip and the tape.

In this embodiment, the first and second plasma etchings are carried out by one plasma processor; however, these two etchings can be carried out by independent processors dedicated to the respective etchings.

In this embodiment, a silicon substrate as a silicon based substrate is discussed; however, the present invention is not limited to this instance, and the similar advantage is obtainable when a silicon-germanium substrate, a SOS (Silicon on silicon) substrate and the like are used.

What is claimed is:

1. A method of surface treatment of a silicon based substrate with plasma, said method comprising the steps of:
performing a first plasma etching for forming fine dimples on a first surface of said silicon based substrate, said first surface of said silicon based substrate being opposite a second surface of said silicon based substrate on which circuit elements are formed; and
performing a second plasma etching for further etching the surface of the fine dimples with plasma produced by gas including fluorine.

2. The method of surface treatment as defined in claim 1, wherein said first plasma etching step uses inert gas for producing plasma.

3. The method of surface treatment as defined in claim 2, wherein said first plasma etching step uses back sputtering of inert gas for forming fine dimples on the silicon based substrate.

4. The method of surface treatment as defined in claim 1, wherein said first plasma etching step uses back sputtering of inert gas for forming fine dimples on the silicon based substrate, and said second plasma etching uses fluorine based gas for reactive ion etching.

5. The method of surface treatment as defined in claim 4, wherein the silicon based substrate is kept at not less than 40° C. in said second plasma etching step.

6. The method of surface treatment as defined in claim 1, wherein the silicon based substrate is kept at not less than 40° C. in said second plasma etching step.

7. The method of surface treatment as defined one of claims 1 through 5, wherein said first plasma etching step and said second plasma etching step are carried out by one plasma processor.

* * * * *